US009112106B2

(12) United States Patent
Bock et al.

(10) Patent No.: US 9,112,106 B2

(45) Date of Patent: Aug. 18, 2015

(54) PRECURSOR COMPOSITION FOR YBCO-BASED SUPERCONDUCTORS

(75) Inventors: Joachim Bock, Erftstadt (DE); Andre Wolf, Cologne (DE); Dirk Isfort, Cologne (DE)

(73) Assignee: NEXANS, Paris (FR)

(*) Notice: Subject to any disclaimer, the term of this patent is extended or adjusted under 35 U.S.C. 154(b) by 1848 days.

(21) Appl. No.: 11/265,526

(22) Filed: Nov. 2, 2005

(65) Prior Publication Data

US 2006/0240989 A1 Oct. 26, 2006

(30) Foreign Application Priority Data

Mar. 11, 2004 (EP) .................................... 04300755

(51) Int. Cl.

*H01L 39/24* (2006.01)
*C04B 35/45* (2006.01)
*C01G 3/00* (2006.01)
*C09C 1/00* (2006.01)

(52) U.S. Cl.

CPC ............ *H01L 39/2477* (2013.01); *C01G 3/006* (2013.01); *C04B 35/4508* (2013.01); *C09C 1/00* (2013.01); *H01L 39/2425* (2013.01); *C01P 2002/72* (2013.01); *C01P 2006/40* (2013.01); *C01P 2006/60* (2013.01); *C04B 2235/3215* (2013.01); *C04B 2235/3225* (2013.01); *C04B 2235/445* (2013.01); *C04B 2235/449* (2013.01)

(58) Field of Classification Search

USPC ......... 505/300, 445, 510, 512, 734, 802, 126, 505/780, 100, 150, 230, 425, 434, 440, 470, 505/781; 427/372.2, 62, 376.2, 331, 126.3; 428/930; 174/125.1; 29/599

See application file for complete search history.

(56) References Cited

U.S. PATENT DOCUMENTS

| | | | | |
|---|---|---|---|---|
| 4,996,187 | A * | 2/1991 | Chai | 505/238 |
| 5,071,833 | A | 12/1991 | Laine et al. | 505/734 |
| 5,231,074 | A * | 7/1993 | Cima et al. | 505/434 |
| 5,820,664 | A * | 10/1998 | Gardiner et al. | 106/287.17 |
| 5,980,983 | A * | 11/1999 | Gordon | 427/226 |
| 6,172,009 | B1 * | 1/2001 | Smith et al. | 505/473 |
| 6,562,761 | B1 * | 5/2003 | Fritzemeier et al. | 505/510 |
| 6,797,338 | B2 * | 9/2004 | Saitoh et al. | 427/561 |
| 2002/0086799 | A1 * | 7/2002 | Araki et al. | 505/100 |

(Continued)

FOREIGN PATENT DOCUMENTS

| | | | |
|---|---|---|---|
| EP | 0328333 | 2/1989 | H07L 39/24 |
| EP | 0328333 | 4/2001 | H01L 39/24 |

(Continued)

OTHER PUBLICATIONS

Gupta et al, "Superconducting oxiide films with high transition temperature prepared from metal trifluoroacetate precursors," Applied Physics Letters, 1988, 52 (24), p. 2277-2279.*

(Continued)

*Primary Examiner* — Stanley Silverman
*Assistant Examiner* — Kallambella Vijayakumar
(74) *Attorney, Agent, or Firm* — Sofer & Haroun, LLP

(57) ABSTRACT

A premixed powdery precursor composition suitable as precursor material for obtaining a coating solution for the preparation of, for instance, thin film superconductors based on YBCO 1:2:3 via a coating technique, wherein the powdery precursor composition comprises a mixture of suitable salts of the constituent elements, in particular salts of trifluoroacetate and acetate.

17 Claims, 2 Drawing Sheets

$Y_2O_3$ + 6 HO-C(=O)-$CF_3$ → 2 Y($OOCCF_3$)$_3$ + $3H_2O$

(56) References Cited

U.S. PATENT DOCUMENTS

| | | | | |
|---|---|---|---|---|
| 2003/0198748 | A1 | 10/2003 | Araki et al. | 427/372.2 |
| 2004/0071882 | A1 * | 4/2004 | Rupich et al. | 427/376.1 |
| 2005/0085394 | A1 * | 4/2005 | Sanchez | 505/100 |

FOREIGN PATENT DOCUMENTS

| | | | | |
|---|---|---|---|---|
| EP | 1482521 | | 3/2003 | H01B 12/06 |
| JP | 06-127942 | * | 5/1994 | C01G 3/00 |
| WO | WO0235615 A2 | | 5/2002 | H01L 39/24 |

OTHER PUBLICATIONS

European Search Report—Feb. 8, 2005.

Metalorganic deposition of high-JcBa2YCu307-x thin films from trifluoroacetate precursors onto (100) SrTiO3 Applied Physics Letters—vol. 68—p. 4183-4187—Dated: Oct. 15, 1990.

Superconducting oxide films with high transition temperature prepared from metal trifluoroacetate precursors Applied Physics—vol. 52—p. 2277-2279—Dated: Jun. 13, 1988.

* cited by examiner

PRECURSOR COMPOSITION FOR YBCO-BASED SUPERCONDUCTORS

RELATED APPLICATIONS

This application is related to and claims the benefit of priority from European Patent Application No. 04 300 755.8, filed on Nov. 3, 2005, the entirety of which is incorporated herein by reference.

FIELD OF THE INVENTION

The present invention is directed to a powdery precursor composition for preparing YBCO-based superconductors or, in general, REBCO-based superconductors. In particular, the present invention is directed to a powdery precursor composition for preparing a coating solution to be used in a coating technique.

BACKGROUND

It is generally known to use solutions of appropriate salts of the constituting elements of YBCO-based superconductors, that is Yttrium, Barium and Copper, with an atomic ratio of about 1:2:3 in coating techniques for preparing films and coatings of the desired superconductor.

According to one approach a mixture of metal trifluoroacetates was prepared from the respective acetates. However, in the resulting metal trifluoroacetates some acetate and water remained bound which proved to be detrimental for the coating process and the properties of the resulting superconductor film.

For overcoming this problem EP 1 187 231 suggests using a purified starting material for preparing the coating solution having a reduced amount of water and acetate bound. That is, according to EP 1 187 231 a mixture of metal triflouroacetate is prepared with Y, Ba and Cu in a suitable atomic ratio of 1:2:3 which is used for preparing the coating solution. In a first step a metal acetate solution is converted to the corresponding metal trifluoroacetate by applying trifluoroacetic acid, and removing solvent, water and acetate by distillation. However, since some of the water and acetate is not free but bound to the metal trifluoroacetate about 2 to 8% of water and acetate remains in the resulting metal material which is described to be a semitransparent, blue gel or sol of the obtained mixture of metal trifluoroacetate.

In a second purification step the obtained sol like or gel like material of the first step is solved in a lower alcohol such as methanol or ethanol in order to displace water/acetate thereby obtaining a mixture of metal trifluoroacetate with reduced water/acetate content after distillation which is a semitransparent blue gel-like or sol like substance. This purified substance is used for preparing the coating solution for carrying out coating.

According to EP 1 187 231 the starting material for preparing the coating solution must be subjected to a purification process before preparing the coating solution in order to reduce the water/acetate content.

The coating process as disclosed in this prior art is therefore rather lengthy due to the time consuming purification steps necessary before coating.

In US 2004/0071882 precursor solutions for preparing YBa2Cu3O-based superconductor films by coating techniques are disclosed. It is suggested dissolving organic metal salts such as acetates and trifluoroacetates, within a suitable solvent for preparing the coating solutions, wherein the ratio of the molar amount of each of the metals Y:Ba:Cu in the coating solution is 1:2.3.

In the process according to US 2004/0071882 the salts used are freshly metered for each separate run and are immediately dissolved in the solvent. There is no indication of a storable premixture which is already ready for immediate use without the need of metering prior to each run.

Separate metering of the components for each run can lead to differing quality in the final superconductor due to weight failure from run to run. Moreover, in particular in small scale processes with only small amounts of salts even small weight failures can lead to drastical deviations from the desired ideal 1:2:3 ratio for the metals.

It would be desirable to have a ready premixed precursor material comprising the salts of the constituent elements in the desired atomic ratio which can be used immediately on demand without pre-treatment such as purification or metering etcetera, which can be stored even over a long term, is ready to use in the preparation of a coating solution without time-consuming pre-treatment steps, and which reduces the risk of quality variation due to weight failures.

Commercially available is a methanolic solution of metal trifluoroacetate of Yttrium, Barium and Copper. However, sedimentation of basic Copper trifluoroacetate is observed within one week rendering the solution unusable.

Thus, there is a need for a premixed precursor material ready for preparing a coating solution for the preparation of YBCO-based superconductors which has long term storability and can be immediately used for preparing the coating solution without any further pre-treatment.

OBJECTS AND SUMMARY

According to the present invention this problem is solved by a powdery precursor composition comprising a mixture of salts of rare earth elements, including Yttrium; Barium and Copper with an atomic ratio of RE:Ba:Cu=1:2:3, wherein at least Barium is present in the form of a salt with a compound containing fluorine, and wherein the powdery precursor material is in the form of premixture suitable for long-term storage.

Figure 1:
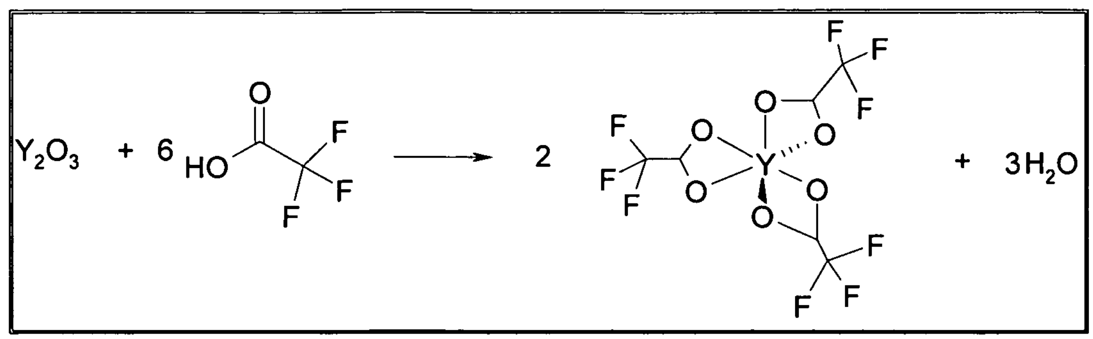
FIG. 1 is a chemical equation of the reaction to produce Yttrium trifluoroacetate, in accordance with one embodiment of the present invention.

The powdery precursor composition of the present invention is useful as a precursor material for preparing a solution for common coating techniques for preparing superconductor coatings or films based on REBaCuO-based superconductors with RE being at least one rare earth element, particularly Y or a combination of two or more of the elements Y, La, Lu, Sc, Sm, Nd or Yb. The powdery precursor composition of the present invention has long term storability and is ready for use without further pre-treatment.

In particular, the present invention, is useful for the preparation of superconductors of the type $REBa_2Cu_3O_x$ wherein RE has the same meaning as above and wherein x stands for the appropriate oxygen content at which the respective compound exhibit superconductivity. For simplification in the following reference is made to YBCO only as preferred embodiment of the present invention. However, it is to be understood that Y can be replaced, partially or totally, by other rare earth elements as set out above.

The composition of the present invention is a powdery, crystalline or microcrystalline mixture comprising the elements Y, Ba and Cu in an atomic ratio resulting in the desired 1:2:3 superconductor. That is, in an atomic ratio of about 1:2:3 wherein slight deviations from this ratio are acceptable.

In the present composition one or more of the constituent elements are present in form of salts of a compound containing fluorine, preferably an organic compound such as trifluoroacetate or a similar organic compound containing fluorine.

Preferably Yttrium (and/or any other RE) is present in the form of trifluoroacetate or a similar organic compound containing fluorine, or acetate or a similar organic compound.

Copper can be present in the form of a salt of a compound containing fluorine preferably an organic compound such as trifluoroacetate or a similar organic compound containing fluorine as well as in the form of acetate or a similar organic compound which can be free of fluorine.

Barium can be present in the form of a salt of a compound containing fluorine preferably an organic compound such as Barium trifluoroacetate or a similar organic compound containing fluorine. However, preferably in the present composition at least Barium is present in the form of trifluoroacetate.

Suitable examples for other compounds are Ba-Bis(6,6,7,7,8,8,8-heptafluoro-2,2-dimethyl-3,5-octanedionate) or similar fluorinated β-Diketonates.

Suitable examples for other organic compounds are fluorinated β-Diketonates e.g 6,6,7,7,8,8,8-heptafluoro-2,2-dimethyl-3,5-octanedione (also referred to herein as "fod").

Preferably Yttrium and Barium are present in form of their trifluoroacetate salt and Copper in form of its trifluoroacetate salt or acetate salt and mixtures thereof.

More preferably all constituent element, i.e. Yttrium, Barium and Copper, are present in form of their trifluoroacetate salts.

Preferably the water content within the premixed powdery precursor composition is less than 1, 5% w/w, more preferably less than 1% w/w. With higher water content the performance of the final superconductor can be affected.

Further it is believed that low water content supports long-term storability.

The powdery precursor composition of the present invention can be obtained by dissolving a mixture of said salts of the constituent elements having a compositional ratio of Y:Ba:Cu of 1:2:3 within a suitable solvent. In the following said mixture of salts is referred to "starting mixture".

Examples for suitable solvents are water, an alcohol such as methanol, acetone or a similar solvent having comparable polarity. For example in the case of the use of fluorinated β-Diketonates suitable solvents are lower ether, i.e. diethylether, toluene, benzene, xylene or other aromatic homologues or supercritical fluids like carbon dioxide or dimethylether.

A preferred solvent is methanol. The salts of the constituent elements and the organic compound should be completely soluble in the solvent.

For example a starting mixture of salts of trifluoroacetic acid and/or acetic acid is completely soluble in a solvent having a polarity in the range of ET30:41 to about 65.3 kcal/mol. ET30 is a betaine dye used as standard for determining the polarity of organic solvents. Examples for such solvents are those set out above.

If desired or on demand the starting mixture can contain further suitable additives such as diethanolamine, ethanoldiamine, polyethylene glycol, propandiol, propantriol, etcetera. These additives can be added in an amount of up to 10% per weight based on the precursor powder, preferably of 0.1 to 5% by weight.

For obtaining the present precursor composition the solvent is removed and the precursor composition of the present invention is obtained as a powdery material. The powdery material is of crystalline or microcrystalline nature.

The steps of dissolving the precursor composition in the solvent and removing the solvent to obtain a dry powder can be repeated. By repeating these steps the content of residual water and excess triflouracetic acid can be further reduced.

The powdery precursor composition of the present invention is a solid material having a crystalline or microcrystalline structure which can be distinguished from a gel like or sol like substance in that X-Ray diffraction patterns are obtainable, and which can be confirmed by Powder X-Ray diffraction.

Such a premixed powdery precursor composition obtained by precipitation and/or crystallisation from a solution of the respective salts is improved with respect to homogeneity compared, for examples, to mixtures obtained by merely admixing the respective salts wherein the homogeneity is limited due to the granularity of the salt particles.

The powdery precursor composition of the present invention can be used as such. However it is also possible to press it into tablets or to store them into vials or any other form suitable for application and/or storage.

In case that the powdery precursor composition of the present invention is provided in vials it is possible to prepare the desired coating solution by simply injecting a suitable solvent into that vial.

The present premixture should be stored in a water-free atmosphere in order to avoid water uptake of the material.

The storability can be improved when the powdery mixture is maintained under an inert atmosphere such as nitrogen etcetera.

The powdery precursor composition of the present invention is storable over a long term and can be directly used for preparing a coating solution by simply dissolving the composition within a solvent suitable for the desired coating technique.

The resulting coating solution can be used for any known coating technique, for instance spin coating dip coating, slit coating, roll printing as well as ink jet printing.

In particular, with the powdery precursor composition of the present invention advantageously thin film superconductors can be prepared, for example by a coating techniques as referred to above.

Since the present powdery precursor material is provided in form of a premixture constant quality of the final superconductors is achieved. For example, by using the present premixture weight failures can be avoided which might occur when metering the metal salt components separately for each run. According to present invention, since the premixed precursor material used for subsequent runs has an identical composition high performance superconductors with constant properties and stoichiometry are obtained.

In the following the present invention is illustrated by specific examples.

In each of the following examples water free solvents were used.

EXAMPLE 1

To a 500 ml three necked flask provided with reflux condenser, dropping funnel, thermometer and PTFE-magnetic stir bar including 66.42 g (1/10 mol) YBCO 1:2:3 were added 150 g (1.16 mol; 101 ml) trifluoroacetic acid (corresponding to an excess of acid of about 1%).

The reaction mixture was allowed to stir at room temperature for about two hours. Then 50 ml deionised water was added via the dropping funnel.

Then the reaction mixture was heated to boiling temperature in a water bath, followed by stirring the mixture in the hot water bath for about two hours.

Then, the reaction mixture was cooled down to 60° C. and 200 ml methanol were added. After cooling down to room temperature the resulting dark blue solution was filtered using a Sartorius pressure filtration kit.

The obtained filtered solution then was dried in a rotary evaporator. The obtained reaction product then was re-dissolved in 200 ml methanol (water-free) and subsequently dried again in the rotary evaporator. This solving and drying procedure was repeated to a total of four times. As final product a bluish green powder was obtained composed of Yttrium trifluoroacetate, Barium trifluoroacetate and Copper trifluoroacetate which comprise crystalline bound water and/or methanol.

Figure 4:
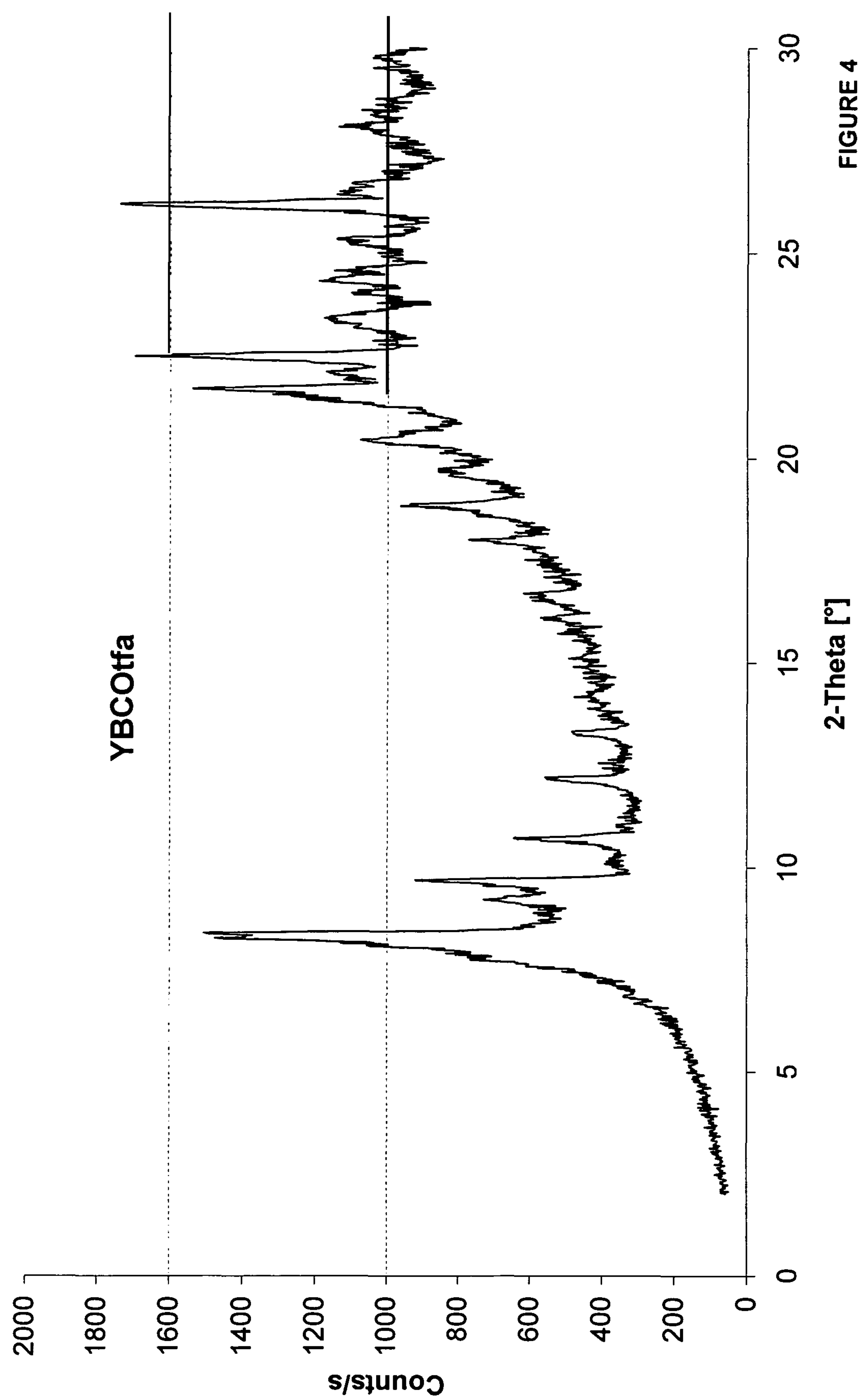
FIG. 4 is a chart of an X-Ray diffraction pattern, in accordance with one embodiment of the present invention.

The crystalline nature of the powder was confirmed by powder X-Ray diffraction pattern as shown in FIG. 4. The X-Ray diffraction pattern was obtained using a diffractometer X-Pert MPD (manufactured by Philips) with Cu—$K_{\alpha}$.

EXAMPLE 2

1. Production of Single Trifluoroacetate Salts of the Elements Yttrium, Barium and Copper 1.1 Yttrium Trifluoroacetate:

To a 500 ml three necked flask provided with reflux condenser, dropping funnel, thermometer and PTFE magnetic stir bar containing 112.9 g (1/2 mol) Yttrium oxide were added 100 ml methanol. Then 116 g (1.01 mol; 79 ml) trifluoroacetic acid were dropped thereto rapidly (corresponding to an excess of acid of about 1%).

Then 50 ml water were added via the dropping funnel.

The reaction mixture was heated to boiling temperature in a water bath with stirring. The mixture was refluxed until it became clear and colourless and no more white sediment was visible about 3 hours. The reaction mixture was then cooled to 60° C. and 200 ml methanol were added.

After cooling to room temperature the resulting clear colourless solution was filtered using a Sartorius pressure filtration kit.

The filtered solution then was dried in a rotary evaporator.

The reaction is presented by the equitation given in FIG. 1.

1.2 Barium Trifluoroacetate:

To a 1000 ml three necked flask provided with reflux condenser, dropping funnel, thermometer and PTFE magnetic stir bar with 315.33 g (1 mol) Barium hydroxide-octahydrate 100 ml methanol ware added. Then 230 g (2.02 mol; 155 ml) trifluoroacetic acid were dropped thereto rapidly (corresponding to an excess of acid of about 1%).

The reaction mixture was heated to boiling temperature in a water bath with wised stirring. The mixture was refluxed until it was clear and colourless and no more white sediment was visible (about 3 hours).

The reaction mixture was then cooled to 60° C. and 300 ml methanol were added.

After cooling down to room temperature the resulting clear colourless solution was pressure filtered using a Sartorius pressure filtration kit.

The filtered solution then was dried in a rotary evaporator.

As final product a white powder was obtained composed of Barium trifluoroacetate and crystalline bound water and/or methanol.

Figure 2:
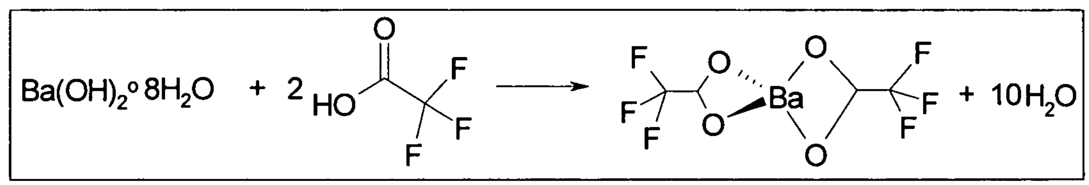
FIG. 2 is a chemical equation of the reaction to produce Barium trifluoroacetate in accordance with one embodiment of the present invention.

The reaction is represented by the equitation shown in FIG. 2.

1.3 Copper Trifluoroacetate:

To a 1000 ml three necked flask provided with reflux condenser, dropping funnel, thermometer and PTFE magnetic stir bar with 166.5 g (3/4 mol) Copper hydroxy carbonate (corresponding to 1.5 mol copper), 150 ml methanol were added. Then, 345 g (3.03 mol; 233 ml) trifluoroacetic acid were dropped thereto rapidly (corresponding to an excess of acid of about 1%).

The reaction mixture was stirred overnight at room temperature and then heated to boiling temperature in a water bath.

The mixture was refluxed until it became dark green and no more light green or light blue sediment was visible. The reaction mixture then was cooled down to 60° C. and 200 ml methanol were added.

After cooling down to room temperature the resulting dark blue solution was pressure filtered using a Sartorius pressure filtration kit.

The filtered solution was dried in a rotary evaporator.

As final product a bluish green powder was obtained composed of Copper trifluoroacetate and crystalline bound water and/or methanol.

Figure 3:
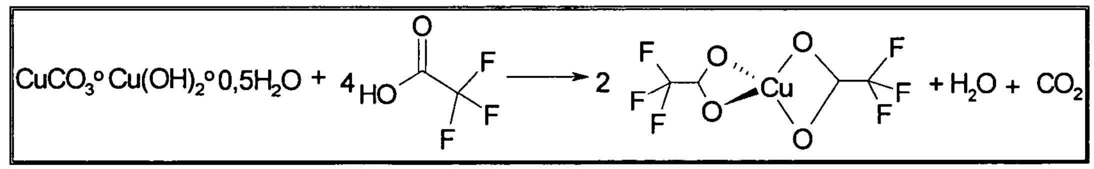
FIG. 3 is a chemical equation of the reaction to produce Copper trifluoroacetate in accordance with one embodiment of the present invention.

The reaction is represented by the equitation shown in FIG. 3.

2. Production of Powdery Precursor Composition of the Present Invention

The trifluoroacetates obtained in 1.1 to 1.3 set out above were mixed in an atomic ratio of Yttrium:Barium:Copper=1:2:3 and solved in methanol.

The solution was dried in a rotary evaporator.

As final product a bluish green powder was obtained composed of Yttrium trifluoroacetate, Barium trifluoroacetate and Copper trifluoroacetate and crystalline bound water and/or methanol.

EXAMPLE 3

1 mol Yttrium trifluoroacetate was mixed with 2 mol Barium trifluoroacetate and 3 mol Copper acetate and solved in methanol.

The solution was dried in a rotary evaporator.

As final product a bluish green powder was obtained composed of Yttrium trifluoroacetate, Barium trifluoroacetate and Copper acetate and crystalline bound water and/or methanol.

EXAMPLE 4

1 mol Yttrium acetate was mixed with 2 mol Barium trifluoroacetate and 3 mol Copper acetate and solved in methanol.

The solution was dried in a rotary evaporator.

As final product a bluish green powder was obtained composed of Yttrium acetate, Barium trifluoroacetate and Copper acetate and crystalline bound water and/or methanol.

The water content within the final premixed powdery precursor composition of the above examples was determined by the well known Karl-Fischer-method commonly used for determining the water content within probes, and it was found that the water content of each of the above examples for the present premixture was less than 1% w/w.

The invention claimed is:

1. A process for preparing a powdery precursor composition for preparing a coating solution, said process comprising the steps of:

preparing a solution that is a mixture that includes only salts of RE, Ba and Cu with organic compounds, wherein RE is at least one rare earth element including Yttrium, wherein the atomic ratio of RE, Ba and Cu is 1:2:3, and wherein at least in case of Ba the organic compound contains fluorine, and removing the solvent to obtain said powdery precursor composition for preparing a coating solution suitable for storage that is subsequently dissolvable in a solution to form a coating solution for a $REBa_2Cu_3$ based superconductor.

2. The process as claimed in claim 1, wherein Ba is present in the composition in the form of either one of trifluoroacetate or fod.

3. The process as claimed in claim 1, wherein RE, Ba and Cu are present in the mixture in the form of either one of trifluoroacetates or fod.

4. The process as claimed in claim 1, wherein RE is Yttrium.

5. The process as claimed in claim 1, wherein the water content within the composition is less than 1.5% w/w.

6. The process as claimed in claim 1, further comprising the steps of placing said composition in vials for storage.

7. The process as claimed in claim 1, wherein the powder is crystalline or microcrystalline.

8. The process as claimed in claim 1, further comprising the step of pressing the powdery precursor composition into tablets.

9. The process as claimed in claim 1, wherein RE and Cu are present in the form selected from the group consisting of trifluoroacetates, fod and acetates.

10. The process as claimed in claim 9, wherein the form of (fod) is 6,6,7,7,8,8,8-heptafluoro-2,2-dimethyl-3,5-octanedionate (fod).

11. The process as claimed in claim 1, wherein Ba is present in the form of trifluoroacetate.

12. The process as claimed in claim 1, wherein Ba is present in the form of fod.

13. Use of a premixed powdery precursor composition as prepared according to claim 1 comprising the steps of:

metering said premixed powdery precursor to a solvent for preparing a coating solution for preparing a RE1Ba2Cu3O-based superconductor material; and applying said coating solution using a coating technique, wherein RE is at least one rare earth element including Yttrium.

14. Use as claimed in claim 13, wherein said coating solution is for the preparation of $Y_1Ba_2Cu_3O$-based superconductor material.

15. Use of a powdery precursor composition as claimed in claim 1 comprising the steps of:

storing said powdery precursor composition for preparing RE1Ba2Cu3O-based superconductor material, wherein RE is at least one rare earth element including Yttrium.

16. Use of a powdery precursor composition as claimed in claim 15 comprising the steps of:

storing said powdery precursor composition for preparing RE1Ba2Cu3O-based superconductor material within vials or is pressed to tablets.

17. Use of a powdery precursor composition as claimed in claim 15 comprising the steps of:

storing said powdery precursor composition for preparing RE1Ba2Cu3O-based superconductor material as a commercially suitable product.

* * * * *